United States Patent
Bustin et al.

(10) Patent No.: US 11,016,156 B2
(45) Date of Patent: May 25, 2021

(54) METHOD OF RECONSTRUCTING MAGNETIC RESONANCE IMAGE DATA

(71) Applicants: Siemens Healthcare Limited, Camberley (GB); King's College London, London (GB)

(72) Inventors: Aurelien Bustin, London (GB); Rene Botnar, London (GB); Claudia Prieto, London (GB); Radhouene Neji, London (GB)

(73) Assignees: Siemens Healthcare Limited, Camberley (GB); King's College, London, London (GB)

( * ) Notice: Subject to any disclaimer, the term of this patent is extended or adjusted under 35 U.S.C. 154(b) by 0 days.

(21) Appl. No.: 16/750,423

(22) Filed: Jan. 23, 2020

(65) Prior Publication Data

US 2020/0241096 A1    Jul. 30, 2020

(30) Foreign Application Priority Data

Jan. 25, 2019   (GB) .................................. 1901024.8

(51) Int. Cl.
*G01R 33/48* (2006.01)
*G01R 33/56* (2006.01)
*G06T 9/00* (2006.01)

(52) U.S. Cl.
CPC ..... *G01R 33/4818* (2013.01); *G01R 33/5601* (2013.01); *G01R 33/5608* (2013.01); *G06T 9/00* (2013.01); *G06T 2207/10088* (2013.01)

(58) Field of Classification Search
CPC ............ G01R 33/4818; G01R 33/5601; G01R 33/5608; G06T 9/00; G06T 2207/10088
See application file for complete search history.

(56) References Cited

U.S. PATENT DOCUMENTS

2007/0110290 A1*  5/2007  Chang ....................... G06T 5/10
                                                                382/128
2017/0172534 A1*  6/2017  Shieh ...................... A61B 6/032
(Continued)

OTHER PUBLICATIONS

Song, P. et al; "Coupled Dictionary Learning for Multi-Contrast MRI Reconstruction"; IEEE International Conference on Image Processing; https://arxiv.org/abs/1806.09930; Jun. 26, 2018.
(Continued)

*Primary Examiner* — G. M. A Hyder
(74) *Attorney, Agent, or Firm* — Schiff Hardin LLP

(57) ABSTRACT

A plurality of sets of k-space data each of the same image region of a subject but having different contrasts are obtained. A sparse image coding procedure is performed to reconstruct a plurality of MR images each corresponding to one of the sets of k-space data. This involves solving an optimization problem comprising a data consistency iteration step used to generate the reconstructed MR images; and a denoising iteration step applied to the reconstructed MR images generated during the data consistency iteration step. The denoising iteration step includes performing a 2D/3D block matching operation to identify similar patches across the reconstructed MR images, and using the similar patches across the reconstructed MR images in a sparsifying operation to provide sparse representations of the reconstructed MR images. The sparse representations are used as an input to the data consistency iteration step.

15 Claims, 4 Drawing Sheets

(56) References Cited

U.S. PATENT DOCUMENTS

2019/0317172 A1* 10/2019 Botnar .................. G01R 33/482
2019/0346522 A1* 11/2019 Botnar ............. G01R 33/56509

OTHER PUBLICATIONS

B. Bilgic et al—Improving Parallel Imaging by Jointly Reconstructing Multi-Contrast Data; Magnetic Resonance in Medicine 80:619-632 (2018).

E. Gong et al. "PROMISE: Parallel-Imaging and Compressed-Sensing Reconstruction of Multicontrast Imaging Using SharablE Information", Magnetic Resonance in Medicine, vol. 73, pp. 523-535, 2015.

Pruessmann, Klaas P. et al. "SENSE: Sensitivity encoding for fast MRI" Magnetic Resonance in Medicine, vol. 42, No. 5, pp. 952-962, Nov. 1999 (First published: Oct. 28, 1999) // https://doi.org/10.1002/(SICI)1522-2594(199911)42:5<952::AID-MRM16>3.0.CO;2-S.

Griswold et al., "Generalized autocalibrating partially parallel acquisitions (GRAPPA)," Magn. Reson. Med., 47:1202-1210 (2002); 2002.

Lustig, M et al: "SPIRIT: Iterative Self-consistent Parallel Imaging Reconstruction From Arbitrary k-Space", in: Mag. Reson. Med. 64, 2010, pp. 457-471.; 2010.

Mariya Doneva et al: "Compressed Sensing Reconstruction for Magnetic Resonance Parameter Mapping"; Magnetic Resonance in Medicine 64:1114-1120 (2010); 2010.

B. Bilgic et al. "Multi-contrast Reconstruction with Bayesian Compressed Sensing", Magn Reson Med., 2011, vol. 66, Nr. 6, pp. 1601-1615, doi: 10.1002/mrm.22956.

Li, "Correlation Imaging for Multiscan MRI with Parallel Data Acquisition" Magnetic Resonance in Medicine 68:2005-2017 (2012).

Lustig, Michael; et All; "Sparse MRI: The application of compressed sensing for rapid MR imaging";Magnetic resonance in medicine 58.6 (2007): 1182-1195.; 2007.

Velikina, Julia A. et al. "Accelerating MR Parameter Mapping Using Sparsity-Promoting Regularization in Parametric Dimension" Magnetic Resonance in Medicine, vol. 70, pp. 1263-1273, 2013; 2013.

* cited by examiner

FIG 1
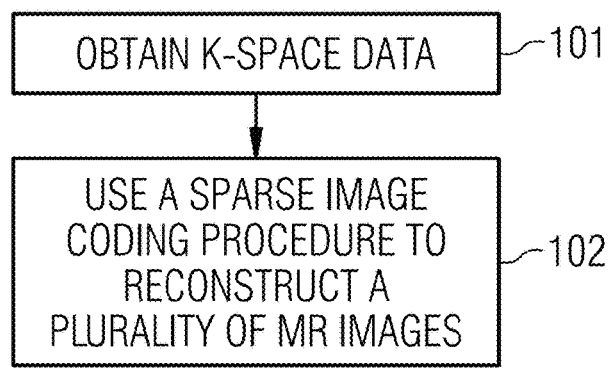
FIG 2A      FIG 2B      FIG 2C
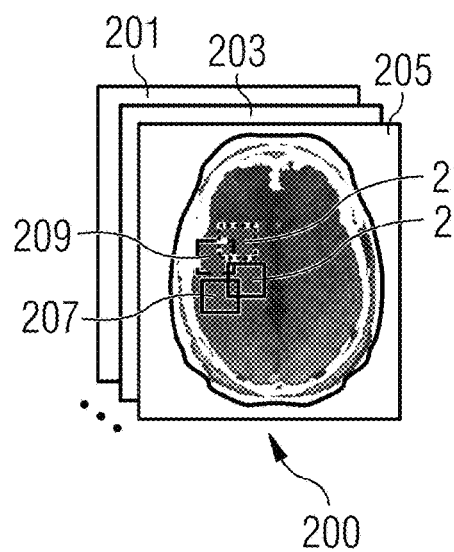 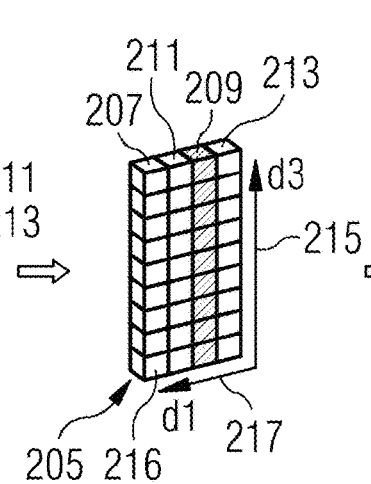 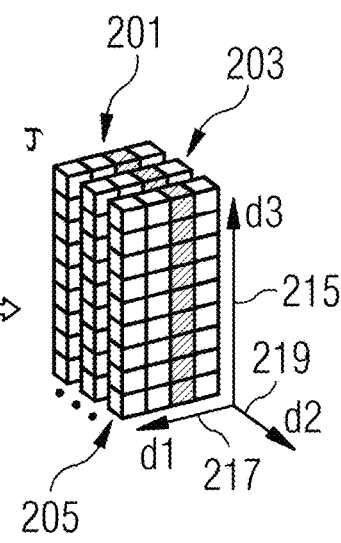

METHOD OF RECONSTRUCTING MAGNETIC RESONANCE IMAGE DATA

FIELD OF THE DISCLOSURE

The present disclosure relates to a method of reconstructing magnetic resonance (MR) image data, a computer readable medium, and a MR imaging apparatus.

In particular the disclosure is concerned with a method of reconstructing magnetic resonance image data from k-space data, and in particular undersampled k-space data.

BACKGROUND

In magnetic resonance (MR) imaging, imaging data is commonly acquired as samples of the Fourier transform of the subject to be reconstructed. These samples are referred to as "k-space" data. The full acquisition of k-space data can take a long time. Because of the long scan times, physiological motion such as respiratory motion and involuntary subject motion can be problematic and introduce motion artefacts. To reduce scan times, k-space data is often acquired using an accelerated, i.e. undersampled, acquisition procedure, so that only a limited number of k-space samples are obtained. The original MR image is then reconstructed from the k-space data using an image reconstruction process which can involve recovering an estimate of the original subject from the under-sampled k-space data.

Parallel imaging is one existing technique used to reconstruct MR images from sampled k-space data. Parallel imaging involves using the known placement and sensitivities of the receiver coils of the MR apparatus to assist in the spatial localization of the MR signal. Parallel imaging techniques process the received signals in parallel along separate channels, one for each receiver coil. This contrasts with non-parallel techniques which first generate a combined signal from the receiver coils before performing the image reconstruction. The parallel imaging techniques consider the relative intensities sensed by the receiver coils and use this information to estimate the location of the tissue corresponding to the sensed signal. The prior information about the receiver coils is therefore exploited for the image reconstruction, which allows for an under-sampled k-space scheme to be used (e.g. by reducing the number of phase encoding steps during image acquisition).

A problem with parallel imaging techniques is that they generally have a low signal to noise ratio when high acceleration factors are used, i.e. when the k-space data is highly undersampled. This may compromise the diagnostic value of reconstructed multi-contrast imaging using parallel imaging techniques.

Compressed sensing techniques are another existing technique used to reconstruct MR images from sampled k-space data. Compressed sensing techniques can involve acquiring undersampled k-space data using a random or pseudo-random sampling pattern. The undersampled k-space data may then be reconstructed by solving an optimization problem of the form:

$$\hat{x} = \underset{x}{\mathrm{argmin}} \left\{ \frac{1}{2} \|Ex - k\|_2^2 + \gamma \Psi_t(x) \right\}$$

x is the reconstructed image series, k is the undersampled k-space data. The encoding operator E=AFS incorporates the sampling matrix A for the k-space data, Fourier transform F and coil sensitivities S.

$\|\cdot\|_2^2$ denotes the $l_2$-norm defined as $\|u\|_2^2 = \sqrt{(\Sigma_i |u_i|^2)}$, for a given vector u defined by vector components $u_i$.

$\Psi_t$ is a 1D temporal total variation (TV) function or a wavelet-based regularization. $\gamma$ is a regularization parameter.

The component $\frac{1}{2}\|Ex-k\|_2^2$ of the optimization problem is known as a data consistency component of the compressed sensing procedure.

The component $\Psi_t(x)$ of the optimization problem is known as a transform sparsity component of the compressed sensing procedure.

The parameter $\gamma$ is a regularization parameter that determines the trade-off between the data consistency and the sparsity.

Compressed sensing techniques can still suffer from residual aliasing artefacts when high acceleration factors (i.e. a highly undersampled scheme) are used. This may compromise the diagnostic value of reconstructed multi-contrast imaging using compressed sensing techniques.

Another form of image reconstruction exploits the anatomical similarity within patches of an image and is known as '3D-Patch-based low-rank ReconstructiOn with Self-similariTy learning (3D-PROST)'. 3D-PROST integrates anatomical structure information from 3D patch neighbourhoods through sparse representation, exploiting the redundancy of 3D patches in the acquired data itself. The optimization problem iterates between a data consistency step, which reconstructs a high-resolution isotropic MR volume x, and a low-complexity 3D patch-based denoising step, which provides a reconstructed volume as prior information for the next step.

The present disclosure is focused on extending the image reconstruction technique to the reconstruction of multiple MR images from a plurality of sets of k-space data each of the same image region of a subject, and acquired with different contrasts. Such multiple MR images are also known as multiple contrasts or 'multi-contrast' MR images. In other words, the present disclosure is focused on multi-contrast MR image reconstruction which refers to the reconstruction of multiple contrast-weighted MR images for the same image region of a subject from k-space data.

Imaging a region of a subject in a multi-contrast fashion is useful for extracting clinically relevant tissue parameters and pathological tissue changes. The multiple contrasts may be achieved using different imaging sequences and preparation pulses (e.g. for different T1 and T2 weightings). Additional applications of multi-contrast images include parameter mapping, such as T1 and T2 mapping, and magnetic resonance fingerprinting, MRF.

MRF can involve a randomized acquisition of MR image data. The randomized acquisition can be performed by varying the acquisition parameters in a pseudo randomised pattern. The signal evolutions, corresponding to the change in signal intensity over time, are recorded. A dictionary is then generated matching the acquisition parameters. Pattern recognition operations are then performed to find the dictionary entry that is the best representation of the acquired signal evolution for each pixel or voxel. The signal evolutions can be considered as 'fingerprints' of tissue properties, which are analysed by comparing them with a file containing all known fingerprints. Each fingerprint in the dictionary points to the MR related identification features of the associated tissue.

It is an object of the present disclosure to provide an improved approach for reconstructing multi-contrast MR image data from accelerated (i.e. undersampled) k-space data, or at least provide an alternative to the existing reconstruction approaches.

SUMMARY

According to the present disclosure there is provided a method and apparatus as set forth in the appended claims. Other features of the disclosure will be apparent from the dependent claims, and the description which follows.

According to a first aspect of the disclosure, there is provided a method of reconstructing magnetic resonance, MR, images from k-space data. The method comprises obtaining a plurality of sets of k-space data each of the same image region of a subject, wherein the sets of k-space data were acquired with different contrasts. The method comprises using a sparse image coding procedure to reconstruct a plurality of MR images each corresponding to one of the sets of k-space data by solving an optimization problem. The optimization problem comprises a data consistency iteration step used to generate the reconstructed MR images. Each of the reconstructed MR images corresponds to one of the sets of k-space data. The optimization problem further comprises a denoising iteration step applied to the reconstructed MR images generated during the data consistency iteration step. The denoising iteration step comprises: performing a 2D/3D block matching operation to identify similar patches across the reconstructed MR images; and using the similar patches across the reconstructed MR images in a sparsifying operation to provide sparse representations of the reconstructed MR images, wherein the sparse representations are used as an input to the data consistency iteration step of the optimization problem.

In general terms, the method reconstructs multi-contrast MR images by performing an iterative procedure, which generates a first estimate of the reconstructed MR images, and then identifies similar patches across the set of reconstructed MR images so that groups of similar patches are obtained. The information within a patch is highly redundant. Further there is a strong correlation between the similar patches across the multiple contrast MR images. Beneficially, this redundancy/correlation is exploited in a sparsifying operation which generates a sparse representation of the reconstructed MR images. The sparse representations of the reconstructed MR images can be considered as denoised reconstructed MR images. The denoised reconstructed MR images are then used as prior knowledge in the next iteration of the optimization procedure. The optimization procedure can be repeated over a plurality of iterations so as to refine the reconstructed MR images. The optimization procedure may be terminated when a convergence criterion is reached. Therefore, the present disclosure exploits high-dimensional redundancies in the data-sets to allow for multi-contrast images to be reconstructed with high image quality.

Existing approaches such as 3D-PROST can be used to reconstruct multi-contrast MR images. However, such approaches perform a separate reconstruction on each contrast image. In other words, each contrast image is reconstructed independently and therefore the correlation between different contrast images is not considered in the reconstruction. Generally, approaches such as 3D-PROST when applied to multi-contrast MR images are able to reach high reconstruction performance for high signal to noise ratio, high contrast to noise ratio singular images, but the reconstruction is generally inadequate for singular images with poor signal to noise ratio and a poor contrast to noise ratio. In addition, simply considering the correlation in the contrast dimension by exploiting the global low-rank and neglecting the local and non-local redundancies, may also lead to poor reconstruction performance. Importantly, the present disclosure considers similar patches across the reconstructed MR images and thus exploits, local, non-local and contrast redundancies in the reconstruction procedure.

The different contrasts for the sets of k-space data may be achieved using different preparation pulses during the image acquisition procedure. Each of the sets of k-space data may be acquired with a different contrast.

The acquired k-space data may be sub-sampled (undersampled) k-space data. A reduced amount of k-space data is generally acquired in order to accelerate the MR acquisition. By sub-sampled, we mean that the k-space data is acquired using fewer echoes than a conventional MR scan. In other words, only data for part of the k-space is collected. The k-space data may be collected using an incoherent sampling scheme. This may be so as to create a noise-like appearance for the aliasing artefacts that are generated as a result of the sub-sampling. The noise-like artefacts may be removed in a subsequent step of the optimization procedure.

As explained above, the MR images are reconstructed from the plurality of sets of k-space data using a sparse coding procedure. The sparse coding procedure comprises solving an optimization problem that comprises a data consistency iteration step and a denoising iteration step, and iteratively solves these two steps.

The data consistency iteration step acts to ensure that the reconstructed MR images are consistent with the original acquired k-space data. That is, the data consistency component may be a constraint on the optimization problem that takes into account the difference between the MR images transformed into k-space and the original acquired k-space. The optimization problem may seek to minimise the difference between the MR images transformed into k-space and the original acquired k-space data. The minimisation may be subject to other constraints, e.g. the denoising iteration step.

The denoising iteration step acts to increase the sparsity of the MR images in a sparse representation space. The increase in sparsity corresponds to a diminishing of the aliasing artefacts in the image space. The optimization seeks to maximise the sparsity. The maximisation may be subject to other constraints, e.g. the data consistency component.

Thus, the sparsifying operation may refer to a procedure in which MR images are reconstructed in a way that is both consistent with the original acquired k-space data and also forms a sparse representation in a dictionary of patches built from the acquired data. In general terms, the principle behind sparse representation assumes that an image, X, can be represented as a sparse linear combination with respect to an appropriately chosen dictionary, $D:X=D\alpha$. $\alpha$ is a sparse vector with very few non-zero entries. Therefore, an efficient recovery of the image X lies in finding the sparsest representation of X through the dictionary D and the sparse coefficient $\alpha$. In this particular implementation, the dictionary is the dictionary of patches built from the acquired data and may be in the form of a high-order tensor $\mathcal{T}$.

The denoising iteration step may comprise minimising an Augmented Lagrangian with respect to sparse coefficients associated with a dictionary for the sparse representations of the plurality of MR images. Significantly, this implements a dictionary leaning method, in which the dictionary and a corresponding sparse representation are jointly learned from the data. In dictionary leaning the goal is to simultaneously find a dictionary and corresponding sparse coefficients to represent the data.

The data consistency iteration step may comprises a determination of the difference between the reconstructed plurality of MR images transformed into k-space and the acquired plurality of sets of k-space data. The determination of the difference may comprise determining the Frobenius norm of the result of the subtraction of the acquired k-space data from the reconstructed MR images transformed into k-space. The reconstructed plurality of MR images may be transformed into k-space using an encoding operator. The encoding operator may comprise a compression operator. The compression operation is used, in particular, for magnetic resonance fingerprinting.

The data consistency iteration step may comprise the function: ½∥EX−Y∥, wherein X is the reconstructed MR images, wherein Y is the plurality of sets of acquired k-space data, wherein E is an encoding operation for transforming the reconstructed MR image data into k-space, and wherein $\|.\|_F^2$ denotes the Frobenius norm. The Frobenius norm is a matrix norm of a matrix defined as the square root of the sum of the absolute squares of its elements.

The encoding operator may be defined as E=AFS. The encoding operator may thus incorporate the undersampling operator $A=\{A_i\}_{i=1}^L$, Fourier transform F, and coil sensitivities $S_c$. The coil sensitivities may be complex coil sensitivities. $S_c$ may be defined as the complex receive-coil sensitivity maps for $N_c$ channels of the MR apparatus and may be denoted as $\{S_c\}_{c=1}^{N_c} \in \mathbb{C}^{M_x \times M_y \times M_z \times N_c}$. The coil-sensitivity maps $S_c$ may be determined from MR acquisitions of a fully-sampled k-space centre using a known eigenvalue-based approach commonly referred to as ESPIRIT. Other techniques for determining the coil sensitivities are available.

The encoding operator may additionally incorporate a compression operator depending on the application. That is, the encoding operator may be defined as $E=AU_TFS_c$. Significantly, incorporating the compression operator allows for the image reconstruction method of the present disclosure to be used for magnetic resonance fingerprinting. The compression operator is, in particular, a temporal compression operator obtained through compression of the MRF dictionary at an appropriate rank, r. By compressing the MRF dictionary in the time domain, the pattern recognition operation performed to find the dictionary entry that is the best representation of the acquired signal evolution for each pixel/voxel can be accelerated. The compression operator is thus beneficial when a large amount of data is acquired, but is not required in all implementations.

The data consistency iteration step may be of the form: $\hat{x}=\text{argmin}_X f(x)$, where $f(x)$ is a function defined as:

{data consistency component in $k$-space+μ/(sparse consistency component in image space)}

Here, μ is a regularization parameter.

The sparse consistency component in image space may comprise a determination of the difference between the reconstructed images, X, and a denoised tensor obtained from the similar patches. The sparse consistency component in image space may additionally incorporate a Lagrangian multiplier, b.

The data consistency iteration step may comprise the function:

$$\frac{\mu}{2}\left\|\mathcal{T} - X - \frac{b}{\mu}\right\|_F^2.$$

That is, the sparse consistency component in image space may be the function $$\left\|\mathcal{T} - X - \frac{b}{\mu}\right\|_F^2.$$

Here, μ is a regularization parameter, and b is an Augmented Lagrangian multiplier. $\mathcal{T}$ is a denoised tensor and is incorporated as prior information. The denoised tensor is obtained at the end of the denoising iteration step. That is, the denoised tensor is the sparse representation of the MR images.

The data consistency iteration step may comprise minimising an Augmented Lagrangian with respect to the plurality of MR images. The Augmented Lagrangian may be of the form:

$$\mathcal{L}(X) := \text{argmin}_X \frac{1}{2}\|EX - Y\|_F^2 + \frac{\mu}{2}\left\|\mathcal{T} - X - \frac{b}{\mu}\right\|_F^2$$

The solution to the data consistency iteration step may be computed using a conjugate gradient algorithm or a simple gradient descent algorithm. Other optimization procedures for solving the data consistency iteration step are available.

The denoising iteration step may comprise a determination of the difference between the reconstructed plurality of MR images and the sparse representations of the reconstructed plurality of MR images. The determination of the difference may comprise determining the Frobenius norm of the result of the subtraction of the sparse representations of the reconstructed plurality of MR images and the reconstructed plurality of MR images.

The denoising iteration step may be of the form: $\hat{x}=\text{argmin}_X f(x)$, where $f(x)$ is a function defined as:

{sparse consistency component in image space + $\frac{2\lambda}{\mu}$ (sparse coefficients associated with a dictionary for the sparse representations of the MR images)}

Here, λ and μ are regularization parameters. λ may be non-negative sparsity-promoting regularization parameter. The regularization parameter λ may be adjustable to adjust the strength of sparsity for the sparse representations of the MR images.

The denoising iteration step may comprise the function: $\Sigma_p \|\mathcal{T}_p - \tilde{\mathcal{T}}_p\|_F^2$, wherein X is the reconstructed MR images with different contrasts, wherein b is the Augmented Lagrangian multiplier, wherein $\mathcal{T}_p$ is the denoised tensor, wherein $$\mathcal{T}_p = P_p(X) + \frac{b_p}{\mu}, P_p(\bullet)$$

is the patch selection operator that forms a tensor for a patch centred at pixel p from the set of multi-contrast images, and wherein $\|.\|_F^2$ denotes the Frobenius norm. That is, the sparse consistency component in image space may comprise the function $\Sigma_p \|\mathcal{T}_p - \tilde{\mathcal{T}}_p\|_F^2$.

The denoising iteration step may comprise the function:

$$\Sigma_p \frac{2\lambda_p}{\mu} \|\mathcal{T}_p\|_*,$$

wherein $$\frac{2\lambda_p}{\mu}$$

is a thresholding parameter that includes the non-negative sparsity-promoting regularization parameter $\lambda_p$, and the regularization parameter $\mu$, wherein $\mathcal{T}_p$ is the denoised tensor, and wherein $\|.\|_*$ denotes the nuclear norm. The nuclear norm is defined as $\|U\|_* = \text{trace}(\sqrt{(U*U)})$. That is, sparse coefficients associated with a dictionary for the sparse representations of the MR images, may comprise the function $\|\mathcal{T}_p\|_*$.

Considering the variable $$\mathcal{T}_p = P_p(X) + \frac{b_p}{\mu},$$

the denoising iteration step can be considering as minimizing with respect to the high-order tensor $\mathcal{T}$, and can be given by the Augmented Lagrangian:

$$\mathcal{L}(\mathcal{T}) := \text{argmin}_\mathcal{T} \sum_p \frac{2\lambda_p}{\mu} \|\mathcal{T}_p\|_* + \sum_p \|\mathcal{T}_p - \tilde{\mathcal{T}}_p\|_F^2$$

The solution to the denoising iteration step may be a denoised version of $\mathcal{T}$, i.e. the denoised tensor, that may be incorporated into the next iteration of the data consistency iteration step as prior knowledge. The Lagrangian multiplier b may then be updated.

In accordance with approaches of the present disclosure, the denoising iteration step is solved on a multi-contrast patch level. That is, the denoising iteration step comprises: performing a 2D/3D block matching operation to identify similar patches across the reconstructed MR images; and using the similar patches across the reconstructed MR images in a sparsifying operation to provide sparse representations of the reconstructed MR images, wherein the sparse representations are used as an input to the data consistency iteration step of the optimization problem.

Using the similar patches across the plurality of MR images in a sparsifying operation may comprise grouping the similar patches together to form a tensor. The method may comprise performing a decomposition of the tensor so as to generate a sparse tensor. The method may comprise using the sparse tensor to obtain the sparse representations of the plurality of MR images.

Using the sparse tensor to obtain the sparse representations of the plurality of MR images may comprise applying a threshold operator to the sparse tensor so as to extract the dominant components of the sparse tensor. The dominant components of the sparse tensor may form the sparse representations of the plurality of MR images. This may involve rearranging the denoised tensor to reconstruct the denoised patches.

Grouping the similar patches together to form a tensor may comprise unfolding the similar patches within each MR image to form a matrix having dimensions N×K, where N is the number of pixels or voxels in each patch, and where K is the number of similar patches within each respective image. The method may further comprise stacking the matrices obtained from the different reconstructed MR images together to form a tensor of dimensions N×K×L, where L represents the number of multi-contrast images to reconstruct.

The decomposition of the tensor so as to generate a sparse tensor may comprise performing a singular value decomposition (SVD) on the tensor. The SVD may be a high-order SVD, and in particular may be a complex high-order SVD. The decomposition of the tensor may comprise unfolding the tensor along its single modes so as to generate a number M of tensors $\mathcal{T}_n$ where m is the number of single modes and where $1 \leq n \leq M$. The SVD may be computed for each of the tensors $\mathcal{T}_n$ so as to generate orthogonal matrices $U^n$ from the $n^{th}$-mode signal subspace. The orthogonal matrices may be used to compute a core tensor $\mathcal{S}$. The core tensor $\mathcal{S}$ may be truncated so as to compute the high-order singular values. The high-order singular values may then be used to obtain the sparse (denoised) tensor.

The reconstruction procedure may consider the complex nature of the multi-contrast MR images. This may be considered by performing a complex high-order SVD. Considering the complex nature of the multi-contrast MR images may mean that a multi-dimensional low-rank may be imposed in the complex domain. This means that the reconstruction process of the present disclosure may capture the possible cross-correlation observed between the real and imaginary components, allowing for accurate and faithful reconstruction of both phase and magnitude in the MR images.

The acquired k-space data may be for two-dimensional (2D) MR images and thus the patches may be 2D patches. The acquired k-space may be for three-dimensional (3D) MR images and thus the patches may be 3D patches.

The plurality of sets of k-space data may have been acquired using undersampled 2D or 3D MR acquisitions. The MR acquisitions may use a 2D radial acquisition scheme.

The 3D MR acquisitions may be performed using a 3D Cartesian trajectory with spiral profile ordering (CASPR). This means that the phase-encoding plane is sampled along approximate spiral interleaves on the Cartesian grid ($k_z$–$k_y$). The angular step between two consecutive successive spiral interleaves in the phase-encoding plane may be given by the golden ratio. In other words, two successive spiral interleaves are rotated by the golden angle.

The 3D MR acquisitions may be performed using a 3D Cartesian variable-density trajectory. The variable-density approach may mean that the centre-region of k-space in the phase-encoding plane is sampled more densely than the outer region of k-space in the phase-encoding plane. The 3D Cartesian variable-density trajectory may have spiral profile ordering (VD-CASPR). Again, the angular step between two consecutive successive spiral interleaves in the phase-encoding plane may be given by the golden ratio (shifted VD-CASPR). In other words, two successive spiral interleaves are rotated by the golden angle.

In the above example shifted 3D MR acquisitions, the rotation by the golden angle may be performed between different contrast acquisitions. This approach is beneficial in introducing incoherently distributed aliasing artefacts along the contrast dimension and noise-like artefacts in the spatial dimension. This is beneficial for the image reconstruction procedure. Other image acquisitions sequences could also be used to introduce incoherent distributed aliasing artefacts along the contrast dimension.

The shifted VD-CASPR sequence, in particular, allows for the fast acquisition of a 3D multi-contrast dataset with high-resolution. The accelerated acquisition using the proposed shifted variable density (shifted VD-CASPR) in concert with the image reconstruction approach of the present disclosure enables high image quality reconstruction of the multi-contrast-images.

The MR acquisitions may use a (2D or 3D) gradient echo sequence. The MR acquisitions may use a (2D or 3D) balanced steady-state free precession (bSSFP) sequence. The MR acquisitions may be accelerated, i.e. undersampled. The MR acquisitions may be synchronised with the subject's heart rate, for example a heart rate sensor may be used to trigger the MR acquisitions. The heart rate sensor may be an ECG, i.e. the acquisitions are ECG gated/triggered. The MR acquisitions may be preceded by one or more preparation pulses. The preparation pulses may be used to achieve the different MR contrasts. The preparation pulses may include at least one or a combination of magnetization transfer pulses, inversion recovery pulses, and T2 prep pulses.

The 2D/3D block matching operation to identify similar patches across the reconstructed MR images may use a L2 distance similarity measure to identify the similar patches across the MR images. The L2 distance used to the determine the patch similarity may be defined as: $d(\text{patch}_{ref}, \text{patch}\_j) = \|\text{patch}_{ref} - \text{patch}_j\|_2$ for $j=1, \ldots, K-1$. Other difference measures such as an L1 distance similarity measure may be used to identify the similar patches across the MR images. The L1 distance similarity measure is also known as the sum of absolute differences. Probabilistic approaches such as mutual information may also be used to identify similar patches. Other approaches such as considering the cross-correlation may also be used to identify similar patches. The present disclosure is not limited to any particular similarity measure for identifying the similar patches. It will be appreciated that there are a number of different similarity measures available for the skilled person, and the skilled person is able to select a desired similarity measure based on factors such as the images to be reconstructed and the processing hardware available to perform the reconstruction.

In addition, the present disclosure is not limited to any particular patch size, N. It will be appreciated that the skilled person will be able to select an appropriate patch size depending on the application and factors such as the resolution of the images to be reconstructed. Generally, a patch size of between 3 and 20, and preferably 3 and 10 is acceptable. That is, for 2D images, the patch size may be between 3×3 pixels and 20×20 pixels, and preferably between 3×3 pixels and 10×10 pixels. For 3D images, the patch size may be between 3×3×3 voxels and 20×20×20 voxels, and is preferably between 3×3×3 voxels and 10×10×10 voxels.

The block matching operation may define a search window around a reference patch in which the block matching operation looks for similar patches. The search window is generally smaller than the MR images. The size of the search window may be selected as appropriate by the skilled person. As the reconstruction time has been found to be generally insensitive to the size of the search window, generally a large search window is preferred since, in this way, the block matching operation can identify more similar patches. The search window range may be between 20 and 60 pixels/voxels, but can be larger or smaller if desired.

The block matching operation may use a patch offset to set a required spacing between patches. This may be used to reduce the search space in the MR images for finding the similar patches. The patch offset may be between 2 and 10, and may be 3 in some examples. A larger patch offset may be used if desired. A patch offset is not required in all examples.

The present disclosure is not limited to any number of multi-contrast MR images. That is, k-space data for any number of MR images can be acquired and subsequently reconstructed in the joint reconstruction process of the present disclosure. The number of multi-contrast MR images can be selected as appropriate depending on the application. In some applications such as MRF, there may be more than 100 multi-contrast images to be reconstructed. In other applications, more than 10, more than 30, or more than 50 multi-contrast MR images may be provided.

According to a second aspect of the disclosure, there is provided a computer readable medium having instructions recorded thereon, which, when executed by a computer, cause the computer to perform the method of the first aspect of the disclosure.

According to a third aspect of the disclosure, there is provided a MR apparatus comprising a computing system, a gradient system, and an excitation system. The gradient system is configured to apply a magnetic field gradient. The excitation system is configured to apply an excitation pulse to the subject and to receive signals from the subject. The computing system is in communication with the excitation system, and the gradient system for controlling these components. The computing system is configured to receive the signals from the excitation system. The computing system is further configured to execute program code to control the gradient system and the excitation system to obtain a plurality of sets of k-space data each of the same image region of a subject. The sets of k-space data are acquired with different contrasts. The computing system is further configured to use a sparse image coding procedure to reconstruct a plurality of MR images each corresponding to one of the sets of k-space data by solving an optimization problem. The optimization problem comprises a data consistency iteration step used to generate the reconstructed MR images. Each of the reconstructed MR images corresponds to one of the sets of k-space data. The optimization problem further comprises a denoising iteration step applied to the reconstructed MR images generated during the data consistency iteration step. The denoising iteration step comprises: performing a 2D/3D block matching operation to identify similar patches across the reconstructed MR images; and using the similar patches across the reconstructed MR images in a sparsifying operation to provide sparse representations of the reconstructed MR images. The sparse representations are used as an input to the data consistency iteration step of the optimization problem.

The computing system may be configured to execute program code for controlling the MR apparatus to perform the method as described above in relation to the first aspect.

BRIEF DESCRIPTION OF THE DRAWINGS

Examples of the present disclosure will now be described with reference to the accompanying drawings, in which:

FIG. 1 shows a process diagram for an example method according to the first aspect of the present disclosure;

FIGS. 2A-2C show details of the denoising iteration step in accordance with example aspects of the present disclosure;

DETAILED DESCRIPTION

Figure 3:
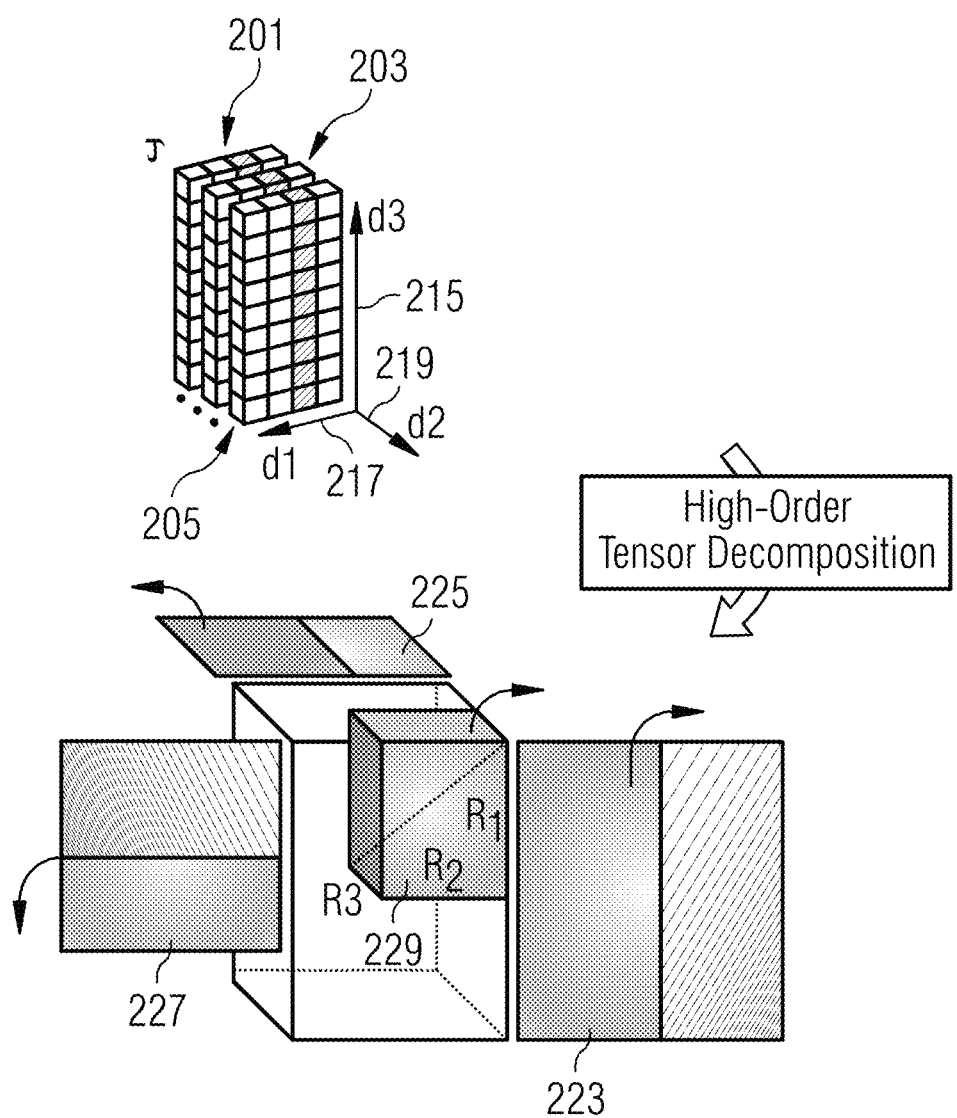
FIG. 3 shows details of the denoising iteration step in accordance with example aspects of the present disclosure.

The present disclosure relates to the reconstruction of a plurality of MR images from a set of MR acquisitions. The MR acquisitions may be 2D or 3D MR acquisitions. The plurality of MR acquisitions have different contrasts, and in particular each of the MR acquisitions may have a different contrast. The different contrasts may be achieved by using different preparation pulses between MR acquisitions. As a consequence, the reconstruction may result in multiple different T1/T2-weighted MR images for the same anatomical section from undersampled k-space data.

The reconstruction is a joint reconstruction, which may mean that the plurality of MR images are reconstructed simultaneously. In other words, the information from all the multi-contrast images is used to reconstruct each image.

In examples of the present disclosure, the MR images are multi-channel images, which may mean that the coil sensitivities of the multiple receiver coils of the MR apparatus are exploited in the MR reconstruction process.

Referring to FIG. 1, there is shown an example image reconstruction process in accordance with aspects of the present disclosure. Step 101 of the reconstruction process comprises obtaining a plurality of sets of k-space data each of the same image region of a subject, wherein the sets of k-space data were acquired using different contrasts. That is, multi-contrast MR acquisitions are performed. The MR acquisitions, i.e. the k-space data, can be denoted as $Y=\{Y_i\}_{i=1}^L \in \mathbb{C}^{M_x \times M_y \times M_z \times L \times N_c}$. $M_x$ denotes the number of voxels in the x spatial direction. $M_y$ denotes the number of voxels in the y spatial direction. $M_z$ denotes the number of voxels in the z spatial direction. L denotes the number of contrast-weighted images. $N_c$ denotes the number of channels, i.e. the number of receiver coils of the MR apparatus. In practice, the k-space data is undersampled and thus may be defined as $Y \in \mathbb{C}^{Z \times L \times N_c}$, where $Z \ll M_x \times M_y \times M_z$. Step 102 of the reconstruction process comprise using a sparse image coding procedure to reconstruct a plurality of MR images from the obtained k-space data. That is, the objective of the reconstruction process of the present disclosure is to reconstruct the multi-contrast MR images X from the k-space data Y in the reconstruction. X can be defined as $X=\{X_i\}_{i=1}^L \in \mathbb{C}^{M_x \times M_y \times M_z \times L}$.

This reconstruction process can be formulated as an inverse problem of the form:

$$\tilde{X} = \arg\min_X \frac{1}{2} \|EX - Y\|_F^2 \quad (1)$$

$\arg\min_X f(X)$ is the argument of the minimum operation and finds the value of the variable X at which the function $f(X)$ is minimised. The variable X is the set of multi-contrast complex images that are to be reconstructed from the k-space data Y in the reconstruction procedure. As above, X can be defined as $X=\{X_i\}_{i=1}^L \in \mathbb{C}^{M_x \times M_y \times M_z \times L}$. In other words, X can be a set of L 2D (if $M_z=1$) or 3D (if $M_z>1$) contrast-weighted complex images. $\tilde{X}$ is the set of jointly reconstructed MR images that are obtained as a result of the reconstruction procedure. $\|.\|_F^2$ denotes the Frobenius norm.

E is an encoding operator that transforms the MR images, X, into k-space. E may be defined as being equal to $AFS_c$. A may be defined as $A=\{A_i\}_{i=1}^L$ and is the undersampling operator that acquires k-space data for each contrast-weighted image at weighting index i. F is the Fourier transform operator. $S_c$ is the complex receive-coil sensitivity maps for the $N_c$ channels and may be denoted as $\{S_c\}_{c=1}^{N_c} \in \mathcal{T}^{M_x \times M_y \times M_z \times N_c}$. These coil-sensitivity maps $S_c$ may be determined from MR acquisitions of a fully-sampled k-space centre using a known eigenvalue-based approach commonly referred to as ESPIRIT.

The equation (1) is an inverse problem because it is attempting to determine the source (the MRI images, X, of the image region) from a limited set of observations (the undersampled k-space data, Y of the image region). This inverse problem is generally ill-posed because there may either be several possible solutions (MRI images) to the problem and no way to determine which solution is the correct one. Further, a solution to the inverse problem may not exist at all. Therefore, to improve the reconstruction process, the present disclosure uses prior assumptions of the unknown solution, X, when solving the inverse problem.

In more detail, the reconstruction process of the present disclosure uses a sparse image coding procedure to reconstruct a plurality of MR images each corresponding to one of the sets of k-space data by solving an optimization problem. This means that sparse representation approach may be adopted to solve the inverse problem. The sparse reconstruction approach assumes that the image, X, can be expressed as a high-order low-rank representation on a patch scale, with respect to an appropriately chosen patch selection operator.

The recovery problem can be formulated as the following constrained optimization on the high-order low-rank tensor $\mathcal{T}$:

$$\tilde{X} = \arg\min_X \frac{1}{2} \|EX - Y\|_F^2 + \Sigma_p \lambda_p \|\mathcal{T}_P\|_* \text{ s.t } \mathcal{T}_P = P_p(X) \quad (2)$$

Here, "s.t" means "such that". In other words, the optimization problem is subject to the constraint that $\mathcal{T}_P = P_p(X)$.

$\lambda$ is a regularization parameter. $\lambda$ is adjustable to adjust the strength of sparsity for the sparse representation of the MR image.

$\|.\|_*$ is the nuclear norm that enforces multi-dimensional low-rank on a multi-contrast patch scale.

The patch selection operator $P_p(.)$ forms a 3D tensor for a patch centred at pixel p from the set of multi-contrast images. This is described in more detail below in relation to the denoising iteration step.

The relationship $\mathcal{T}_P = P_p(X)$ in equation (2) is a constraint of the optimization problem. An unconstrained Augmented Lagrangian of equation (2) can be formed by linearly combining the constraint, $\mathcal{T}_P = P_p(X)$, and a cost function.

$$\mathcal{L}(X, \mathcal{T}, b) := \arg\min_{X,\mathcal{T},b} \frac{1}{2} \|EX - Y\|_F^2 + \sum_p \lambda_p \|\mathcal{T}_p\|_* + \frac{\mu}{2} \sum_p \left\| \mathcal{T}_p - P_p(X) - \frac{b_p}{\mu} \right\|_F^2 \quad (3)$$

The term $$\frac{\mu}{2} \Sigma_p \left\| \mathcal{T}_p - P_p(X) - \frac{b_p}{\mu} \right\|_F^2$$

is a penalty term. μ is a penalty parameter. b is an Augmented Lagrangian multiplier. Equation (3) is solved iteratively through operator-splitting via the alternating direction method of multipliers (ADMM) approach. ADMM simplifies the optimization process by alternating the minimisation with respect to the multi-contrast set of images (optimization 1) and the high-order tensor $\mathcal{T}$ (optimization 2) followed by an update of the Augmented Lagrangian multiplier b. These steps may be repeated until a convergence criterion is satisfied.

The optimization 1 is a data consistency step that is used to generate the reconstructed MR images. Each of the reconstructed MR images corresponds to one of the sets of k-space data. The optimization 2 is a denoising iteration step which is applied to the reconstructed MR images generated during the data consistency iteration step. The results of optimization 2 are used as an input to optimization 1.

Iteration Stage 1—Data Consistency Iteration Step

The data consistency iteration step is used to generate the reconstructed plurality of sets of MR image data. The data consistency iteration step may be formed as a MR reconstruction problem that reconstructs all of the sets of MR image data jointly. This may be referred to as a joint multi-contrast reconstruction problem.

In one example, the data consistency iteration step comprises minimising an Augmented Lagrangian with respect to the plurality of sets of MR image data. The reconstruction is a joint reconstruction as the MR images are reconstructed jointly. The Augmented Lagrangian may be in the form of the following equation:

$$\mathcal{L}(X) := \operatorname{argmin}_X \frac{1}{2}\|EX - Y\|_F^2 + \frac{\mu}{2}\left\|\mathcal{T} - X - \frac{b}{\mu}\right\|_F^2$$

The Augmented Lagrangian incorporates the denoised tensor $\mathcal{T}$ as prior information. The denoised tensor is obtained at the end of the denoising iteration step.

During the initial iteration step, the penalty parameter μ may be set equal to zero. In subsequent iterations of the data consistency iteration step, μ may be set to a non-zero value. Further, the values of the denoised tensor may be obtained from the previous iteration of denoising iteration step. The Augmented Lagrangian multiplier b may also be updated before each iteration of the data consistency iteration step.

Iteration Stage 2—Denoising Iteration Step

The denoising iteration step is applied to the reconstructed plurality of sets of MR image data generated during the data consistency iteration step. The denoising iteration step comprises identifying similar patches across the reconstructed plurality of MR images. The similar patches are used in a sparsifying operation to provide sparse representations of the reconstructed plurality of sets of MR image data. The sparse representations (e.g. the denoised tensor $\mathcal{T}$) are used as an input to the data consistency iteration step of the optimization problem In one example, the denoising iteration step comprises minimising an Augmented Lagrangian with respect to the high-order tensor $\mathcal{T}$. The Augmented Lagrangian may be in the form of the following equation:

$$L(\mathcal{T}) := \operatorname{argmin}_{\mathcal{T}} \sum_p \frac{2\lambda_p}{\mu}\|\mathcal{T}_p\|_* + \sum_p \|\mathcal{T}_p - \tilde{\mathcal{T}}_p\|_F^2$$

Here, the variable $\tilde{\mathcal{T}}_p$ as given by the data consistency iteration step and is defined as:

$$\tilde{\mathcal{T}}_p = P_p(X) + \frac{b_p}{\mu}$$

The denoising iteration step exploits the property that on a local scale voxels (or pixels for 2D MR images) at a specific location for a give contrast will exhibit similar intensity to their nearest neighbours. Further, on a non-local scale, images for a given contrast contain self-repeating patterns. Further still, on a global scale, common structures and features are shared across multiple contrast images. Due to these properties, the Augmented Lagrangian may be solved on a multi-contrast patch level.

The construction the tensor, $\mathcal{T}$ may be performed as a three-step process. In step 1, similar patches across the reconstructed plurality of MR images are extracted, vectorised and concatenated into a tensor. In step 2, sparsity of this tensor is enforced using complex singular value decomposition (SVD) and by hard thresholding the singular values below a specific threshold. In step 3, the denoised patches are then placed back to their original positions by averaging.

In step 1 of the process, a 2D/3D block matching operation is performed to identify similar patches across the reconstructed MR images. This means that similar patches in $$X + \frac{b}{\mu}$$

are grouped together to form a third order tensor. For example, considering a 3D+L reference patch of size $N_x \times N_y \times N_z \times L$, a high dimensional stack, i.e. a tensor $\tilde{\mathcal{T}}_p \in \mathbb{C}^{N \times K \times L}$ of K−1 similar 3D+L patches, with $P = N_x \times N_y \times N_z$ is formed. A fixed local window may be used for the patch search.

Referring to FIGS. 2A-2C there is shown a detailed overview an example process of grouping similar patches together to form a tensor.

FIG. 2A shows a set 200 of reconstructed MR images 201, 203, 205 obtained as a result of the data consistency iteration step. Four similar patches 207, 209, 211, 213 have been found in the MR image 205 using a block matching operation.

FIG. 2B shows that each of the four similar patches 207, 209, 211, 213 is unfolded which means that the voxels within each patch 207, 209, 211, 213 are arranged into a vector, i.e. the patches 207, 209, 211, 213 are vectorised. The vectorised patches 207, 209, 211, 213 are concatenated together into a 2D matrix 216. In FIG. 2B it can be seen that the voxels within each patch 207, 209, 211, 213 are arranged along the axis $d_3$ 215 which represents the local similarity, i.e. the voxel similarity within each patch. The vectors are concatenated together along the axis $d_1$ 217 which represents the non-local similarity, i.e. the similarity between different patches 207, 209, 211, 213 in the MR image 205.

FIG. 2C shows that similar patches are found in the other MR images 201, 203. The similar patches for each MR image 201, 203 are unfolded and concatenated together into a 2D matrix. The 2D matrices are stacked together along the axis $d_2$ 219 which represents the contrast dimension to form a tensor $\tilde{\mathcal{T}}_p$.

In step 2 of the process, tensor, $\tilde{\mathcal{T}}_p$, which exhibits strong low multilinear rank structure, is compressed into a tensor of a smaller size (core tensor), through a tensor decomposition operation. The tensor $\tilde{\mathcal{T}}_p$ is a high order tensor of size P×K×L and admits a low multilinear rank approximation, and can be compressed through tensor decomposition by truncating the multilinear singular vectors that correspond to small multilinear singular values. The dominant component of the decomposed core tensor $\tilde{\mathcal{T}}_p$ may be extracted by computing a complex-valued higher-order singular value decomposition (HOSVD), and by only keeping the largest (given by the thresholding parameter $$\frac{2\lambda_p}{\mu})$$

multilinear singular vectors and multilinear singular values. This step effectively acts as a high-order denoising process where the small discarded multilinear coefficients mainly reflect contributions from noise and noise-like artefacts. The result of step 2 is the denoised tensor $\hat{\mathcal{T}}_p$.

Figure 4:
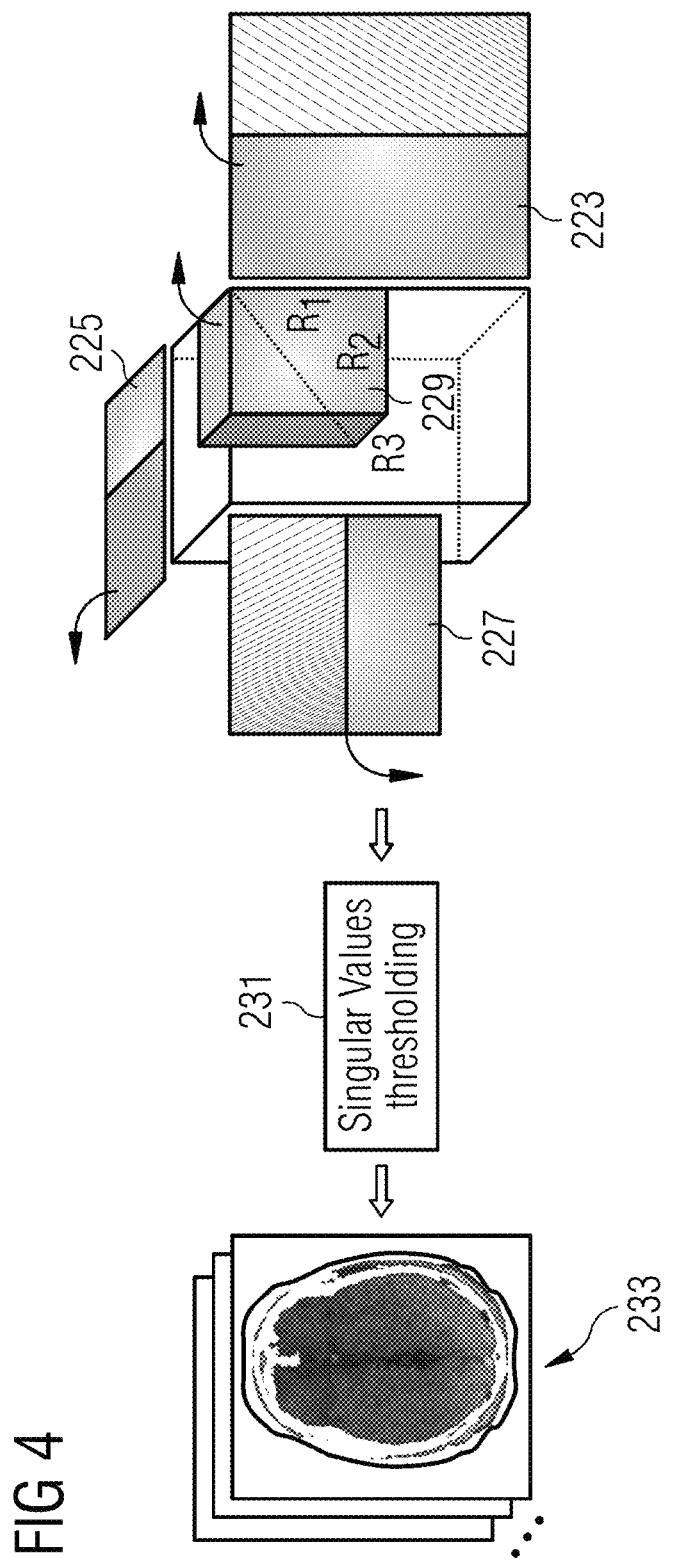
FIG. 4 shows details of the denoising iteration step in accordance with example aspects of the present disclosure.

FIG. 3 shows an example operation for high-order tensor decomposition. In this example, the tensor $\mathcal{T}$ is unfolded along its single modes and the complex SVD of the unfolded tensors are computed to generate the orthogonal matrices $U^{(1)}$, $U^{(2)}$, $U^{(3)}$. Element 223 in FIG. 3 shows the orthonormal basis for the patch space: $U^{(1)}$, element 225 shows the orthonormal basis for the contrast space: $U^{(2)}$, and element 227 shows the orthonormal basis for the local space: $U^{(3)}$. The core tensor 229 is then computed from the orthogonal matrices $U^{(1)}$, $U^{(2)}$, $U^{(3)}$. FIG. 4 shows an example of the singular values thresholding step 231 so as to arrive at the denoised tensor $\hat{\mathcal{T}}_p$, which can de used to form a denoised set of MR images 233. A detailed example of a tensor decomposition algorithm is provided below.

In step 3 of the process, the denoised tensor $\hat{\mathcal{T}}_p$, is rearranged to form the denoised patches. Steps 1-3 are repeated over all patches in the image in a sliding window fashion. Since a single patch might belong to several groups in step 1, the final denoised multi-contrast complex-valued images $\mathcal{T}$ are obtained by averaging (also known as aggregating) the different estimates.

The solution $\mathcal{T}$ of the denoising iteration step is a denoised version of $\tilde{\mathcal{T}}$ that is incorporated into the data consistency iteration step as prior knowledge. The Lagrangian multiplier b is then updated and the data consistency and denoising iteration steps are processed iteratively to improve the quality of the reconstructed images.

In general terms, an example reconstruction procedure in accordance with the present disclosure receives, as input, the under-sampled k-space data Y for multi-contrast images X, the parameters $\lambda_p$, $\mu$, and the number of ADMM iterations to be performed $ADMM_{iter}$, if required, e.g. for MRF, a compression operator $U_r$ will also be received as an input.

An initialization is performed which comprises performing the data consistency iteration step so that a joint reconstruction of the MR images X from the k-space data Y without prior information ($\mu$=0) is performed. Then, during each iteration of the optimization procedure (i.e. for each iteration, i, where i=1, ..., $ADMM_{iter}$), the data consistency iteration step is performed to generate a denoised tensor ($\mathcal{T}^{(i)}$) and then the data consistency iteration step is performed with prior information ($\mathcal{T}^{(i)}$) to generate the reconstructed MR images $X^{(i)}$. In these iterations, the penalty parameter $\mu$ is set to a non-zero value. The penalty parameter can be a constant value so that it is the same for each iteration, or may be updated after each iteration. At the end of each iteration, the Lagrangian multiplier is updated (e.g. $b^{(i)} = b^{(i-1)} + X^{(i)} - \mathcal{T}^{(i)}$). The next iteration is then performed until i=$ADMM_{iter}$. The value $ADMM_{iter}$, i.e. the number of iterations, can be selected as appropriate by the skilled person. Normally, a value large enough to ensure that the optimization problem converges is selected. The value $ADMM_{iter}$ is normally within the range of 5-10, but can be larger if desired.

High-Order Tensor Decomposition Algorithm

An example high-order decomposition algorithm used in step 2 of the denoising iteration step is now described.

The inputs for the decomposition algorithm are the tensor $\mathcal{T}$ formed from the similar patches, and having dimensions (N, K, L) and the regularization parameter $\lambda$.

In a first step, the tensor $\mathcal{T}$ is unfolded along its single modes so as to generate:
$\mathcal{T}_1$: which reshapes $\mathcal{T}$ into a L×(N·K) complex matrix;
$\mathcal{T}_2$: which reshapes $\mathcal{T}$ into a N×(L·K) complex matrix;
$\mathcal{T}_3$: which reshapes $\mathcal{T}$ into a K×(L·N) complex matrix;

In a second step, the complex singular value decomposition is computed for each of the unfolded tensors $\mathcal{T}_1$, $\mathcal{T}_2$, $\mathcal{T}_3$ so as to obtain the orthogonal matrices $U^{(1)}$, $U^{(2)}$, $U^{(3)}$ from the $n^{th}$-mode signal subspace.

In a third step, the complex core tensor $\mathcal{S}$ is computed. The complex core tensor $\mathcal{S}$ is defined according to the following relationship:

$$\mathcal{S} = \mathcal{T} \times_1 U_{(1)}^H \times_2 U_{(2)}^H \times_3 U_{(3)}^H$$

This is equivalent to:

$$\mathcal{S}_n = U_{(n)}^H \cdot \mathcal{T}_n \cdot [U_{(i)} \otimes U_{(j)}] \text{ with } 1 \leq n \leq 3 \text{ and } i \neq j \neq n$$

$\otimes$ denotes the Kronecker product.

In a fourth step, a thresholding operation is performed on the core tensor S so as to compute the high-order singular values. In other words, the following threshold operation is performed:

$$\mathcal{S}(\mathcal{S}_{<\lambda}) = 0$$

In a fifth step, the filtered, denoised, tensor, $\hat{\mathcal{T}}_n$ is reconstructed.

This can be performed using the following operation:

$$\hat{\mathcal{T}}_n = U_n \cdot \mathcal{S} \cdot [U_{(i)} \otimes U_{(j)}]^H \text{ with } 1 \leq n \leq 3 \text{ and } i \neq j \neq n$$

The denoised, tensor, $\hat{\mathcal{T}}_n$ is output as a result of the high-order tensor decomposition algorithm.

Example Implementation— 3D Multi-Contrast Magnetization Transfer Imaging

In this example, image reconstruction is performed on 3D image acquisitions performed with different magnetization-transfer (MT) weightings. One reference image is acquired without magnetization preparation, and five images with different MT preparations are also acquired. In this example, the number L of multi-contrast 3D images to be reconstructed is 6 and the number of voxels in the z-direction ($M_z$) is greater than 1.

The MT weighted images are acquired using the shifted VD-CASPR sequence. This means that the spiral interleave is rotated by the golden angle between different contrast acquisitions. This introduced incoherently distributed artefacts along the contrast dimension and noise-like artefacts along the spatial dimension.

The MT weightings were achieved by using different MT preparation pulses, and in particular comprises applying a train of sinc-shaped, off-resonance RF pulse before image acquisition. Six measurements were therefore acquired using different MT pulse flip angles, which in this particular example were: $\alpha_{MT}$=[0°, 160°, 3200, 480°, 640°, 800°]. There was a five second pause between the different MT acquisitions. The acquisitions were performed with an acceleration factor of 6.5-fold for each weighted image, and the total scan time to acquire the six measurements was 13 minutes and 18 seconds. A fully-sampled acquisition, by contrast would take more than an hour.

The multi-contrast MR images were reconstructed from the acquired sets of k-space data using the MR reconstruction procedure in accordance with the present disclosure.

This example used a patch size P=7×7×7, a search window=20×20×20, and set the number of similar 3D patches to be selected equal to K=30. Patch offset=3.

The number of iterations of the two-step optimization procedure of the present disclosure was set to be equal=5. The tolerance of the conjugate gradient method used to solve the data consistency step was set to $CG_{eps}$=1 $e^{-7}$, and the maximum number of iterations for the data consistency step was set to $CG_{iter}$=10. The threshold parameters were defined as $\lambda$=0.1 and $\mu$=$5e^{-3}$ Coil sensitivity maps for use in the encoding operator E were estimated from fully-sampled k-space centre using the known eigenvalue-based approach commonly referred to as ESPIRIT.

Magnetic Resonance Fingerprinting (MRF)

As explained previously, MRF allows the simultaneous acquisition of multi-parametric maps (e.g. T1, T2, B0) in a single scan. Conventional MRF sequences acquire in the order of thousand highly-undersampled time-point images by pseudo-randomly collecting the MR data in a continuous fashion with time-varying acquisition parameters (e.g. repetition time, flip angle). The spatial and temporal incoherencies provide a unique signal evolution (or fingerprint) for each tissue. These unique fingerprints can be matched, through pattern matching, to a pre-generated dictionary representative of the MRF sequence, and whose atoms are composed of simulated signal evolution curves. This matching process is performed on a voxel-by-voxel basis to identify the underlying tissue properties and generate quantitative parameter maps. The highly-undersampled pseudo-random MRF acquisition results in a high level of noise and aliasing in the reconstructed time-point images.

Due to the multi-contrast nature of MRF, the MR image reconstruction process of the present disclosure can be used to explicitly exploit the local, non-local and contrast information of the temporally compressed images by integrating the compression operator into the encoding operator E as follows:

$E_{MRF} = AU_rFS_c$ $U_r$ is the compression operator.

Example Implementation—2D MRF

An example 2D MRF reconstruction procedure will now be desired. In this example, the acquired data was temporally compressed with r=10, leading to only 10 singular value images to reconstruct. L=10, Mz=1. The encoding operator, $E_{MRF}$, was implemented using a nonuniform fast Fourier transform.

The tolerance of the conjugate gradient method used to solve the data consistency step was set to $CG_{eps}$=1 $e^{-4}$, and the maximum number of iterations performed by the conjugate gradient method to solve the data consistency step was set to $CG_{iter}$=15. The threshold parameters were defined as ë=0.1 and $\mu$=$5e^{-3}$ This example used a patch size P=7×7, a search window=20×20 and set the number of similar 3D patches to be selected equal to K=20. The patch offset (i.e. the required spacing between patches) was set to be equal to 3. In other words, in order to save computational complexity, a sliding-window approach was performed with a patch offset of 3 pixels at each image dimension.

This results in the formation of a third-order tensor formed, $\mathcal{T}$, of size 49×20×10. The block matching operation used the L2 distance as the measure of patch similarity.

The data consistency and denoising steps were iterative interleaved and reconstruction was terminated after 5 ADMM iterations.

It will be appreciated that the present disclosure is not limited to 3D MTC imaging or 2D MRF imaging. These are just examples. The present disclosure can be used in any situation where multi-contrast MR images are required to be reconstructed.

Magnetic Resonance Apparatus

Figure 5:
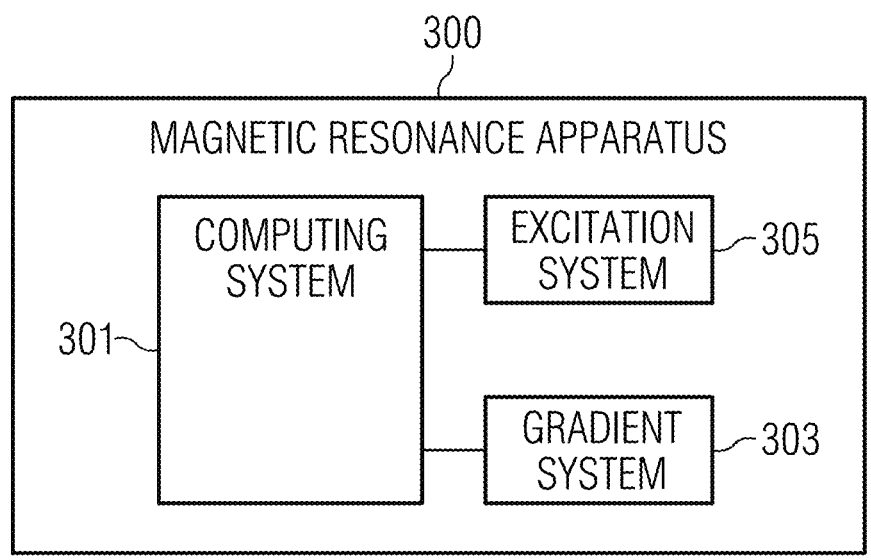
FIG. 5 shows an example MR apparatus according to the second aspect of the present disclosure.

Referring to FIG. 5, there is shown an example MR apparatus 300 according the second aspect of the disclosure. The MR apparatus 300 comprises a computing system 301, a gradient system 303, and an excitation system 305.

The gradient system 303 is configured to apply a magnetic field gradient. The gradient system 303 may be configured to apply magnetic field gradients along three spatial axes.

The excitation system 305 may comprise a transmitter (not shown) and a receiver (not shown). The excitation system 305 can be an RF system with one or more RF coils (not shown). The excitation system 305 is configured to apply an excitation pulse to the subject and to receive signals from the subject.

The MR apparatus 300 includes a magnet (not shown) for establishing a stationary magnetic field. The magnet can include a permanent magnet, a superconducting magnet or other type of magnet.

The computing system 301 is in communication with the excitation system 305, and the gradient system 303 for controlling these components. The computing system 301 is configured to receive the signals from the excitation system 305.

The computing system 301 is further configured to execute program code to control the gradient system 303 and the excitation system 305 to acquire a plurality of sets of k-space data each of the same image region of a subject. The sets of k-space data are acquired with different contrasts.

The computing system 301 is further configured to use a sparse image coding procedure to reconstruct a plurality of MR images each corresponding to one of the sets of k-space data by solving an optimization problem. The optimization problem comprises a data consistency iteration step used to generate the reconstructed MR images. Each of the reconstructed MR images corresponds to one of the sets of k-space data. The optimization problem further comprises a denoising iteration step applied to the reconstructed MR images generated during the data consistency iteration step. The denoising iteration step comprises: performing a 2D/3D block matching operation to identify similar patches across the reconstructed MR images; and using the similar patches across the reconstructed MR images in a sparsifying operation to provide sparse representations of the reconstructed MR images, wherein the sparse representations are used as an input to the data consistency iteration step of the optimization problem.

In summary, there is provided a method of reconstructing MR image data. A plurality of sets of k-space data each of the same image region of a subject but having different contrasts are obtained. A sparse image coding procedure is performed to reconstruct a plurality of MR images each corresponding to one of the sets of k-space data. This involves solving an optimization problem, which comprises a data consistency iteration step used to generate the reconstructed MR images; and a denoising iteration step applied to the reconstructed MR images generated during the data consistency iteration step. The denoising iteration step comprises: performing a block matching operation to identify similar patches across the reconstructed MR images; and using the similar patches across the reconstructed MR images in a sparsifying operation to provide sparse representations of the reconstructed MR images, wherein the sparse representations are used as an input to the data consistency iteration step of the optimization problem. A computer readable medium and an MR apparatus are also provided.

At least some of the example embodiments described herein may be constructed, partially or wholly, using dedicated special-purpose hardware. Terms such as 'component', 'module' or 'unit' used herein may include, but are not limited to, a hardware device, such as circuitry in the form of discrete or integrated components, a Field Programmable Gate Array (FPGA) or Application Specific Integrated Circuit (ASIC), which performs certain tasks or provides the associated functionality. In some embodiments, the described elements may be configured to reside on a tangible, persistent, addressable storage medium and may be configured to execute on one or more processors. These functional elements may in some embodiments include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. Although the example embodiments have been described with reference to the components, modules and units discussed herein, such functional elements may be combined into fewer elements or separated into additional elements.

It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the disclosure as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

Although a few preferred embodiments have been shown and described, it will be appreciated by those skilled in the art that various changes and modifications might be made without departing from the scope of the disclosure, as defined in the appended claims.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention claimed is:

1. A method of reconstructing magnetic resonance (MR) images from k-space data, the method comprising:
   obtaining a plurality of sets of k-space data each of the same image region of a subject, wherein the sets of k-space data are acquired with different contrasts;
   using a sparse image coding procedure to reconstruct a plurality of MR images, each corresponding to one of the sets of k-space data by solving an optimization problem, the optimization problem comprising:
      a data consistency iteration step used to generate the reconstructed MR images, wherein each of the reconstructed MR images corresponds to one of the sets of k-space data;
      a denoising iteration step applied to the reconstructed MR images generated during the data consistency iteration step, wherein the denoising iteration step comprises:
         performing a 2D/3D block matching operation to identify similar patches across the reconstructed MR images; and
         using the similar patches across the reconstructed MR images in a sparsifying operation to provide sparse representations of the reconstructed MR images, wherein the sparse representations are used as an input to the data consistency iteration step of the optimization problem.

2. A method as claimed in claim 1, wherein the data consistency iteration step comprises determining a difference between the reconstructed plurality of MR images transformed into k-space and the acquired plurality of sets of k-space data.

3. A method as claimed in claim 2, wherein the reconstructed plurality of MR images are transformed into k-space using an encoding operator comprising a compression operator.

4. A method as claimed in claim 1, wherein the data consistency iteration step comprises minimising an Augmented Lagrangian with respect to the plurality of MR images.

5. A method as claimed in claim 1, wherein the data consistency iteration step is of the form: $\hat{x} = \mathrm{argmin}_x f(x)$,
   where $f(x)$ is a function defined as:
   {data consistency component in $k$-space+(sparse consistency component in image space)}, and
   $\mu$ is a regularization parameter.

6. A method as claimed in claim 1, wherein the denoising iteration step comprises determining a difference between the reconstructed plurality of MR images and the sparse representations of the reconstructed plurality of MR images.

7. A method as claimed in claim 1, wherein the denoising iteration step comprises minimising an Augmented Lagrangian with respect to sparse coefficients associated with a dictionary for the sparse representations of the plurality of MR images.

8. A method as claimed in claim 1, wherein the denoising iteration step is of the form: $\hat{x}=\text{argmin}_x f(x)$, where $f(x)$ is a function defined as:

{sparse consistency component in image $$\text{space} + \frac{2\lambda}{\mu}$$

(sparse coefficients associated with a dictionary for the sparse representations of the MR images)} wherein $\lambda$ and $\mu$ are regularization parameters.

9. A method as claimed in claim 1, wherein using the similar patches across the plurality of MR images in a sparsifying operation comprises:
   grouping the similar patches together to form a tensor;
   performing a decomposition of the tensor so as to generate a sparse tensor; and
   using the sparse tensor to obtain the sparse representations of the plurality of MR images.

10. A method as claimed in claim 9, wherein the using the sparse tensor to obtain the sparse representations of the plurality of MR images comprises applying a threshold operator to the sparse tensor so as to extract the dominant components of the sparse tensor.

11. A method as claimed in claim 9, wherein the grouping the similar patches together to form the tensor comprises:
   unfolding the similar patches within each MR image to form a matrix having dimensions N×K, where N is the number of pixels or voxels in each patch, and K is the number of similar patches within each respective image; and
   stacking the matrices obtained from the different reconstructed MR images together to form a tensor of dimensions N×K×L, where L is the number of reconstructed MR images.

12. A method as claimed in claim 9, wherein the decomposition of the tensor so as to generate a sparse tensor comprises performing a singular value decomposition (SVD) on the tensor.

13. A method as claimed in claim 9, wherein the k-space data is acquired using 3D MR acquisitions, and the 3D MR acquisitions are performed using a variable-density 3D Cartesian trajectory with spiral profile ordering.

14. A non-transitory computer readable medium having instructions recorded thereon, which, when executed by a computer, cause the computer to perform the method of claim 1.

15. A magnetic resonance (MR) apparatus comprising:
   a computing system;
   a gradient system configured to apply a magnetic field gradient; and
   an excitation system configured to apply an excitation pulse to a subject and to receive signals from the subject,
   wherein the computing system is in communication with the excitation system and the gradient system for controlling these components, and is configured to receive the signals from the excitation system, and execute program code to control the gradient system and the excitation system to:
   obtain a plurality of sets of k-space data each of the same image region of a subject, wherein the sets of k-space data were acquired with different contrasts; and
   use a sparse image coding procedure to reconstruct a plurality of MR images each corresponding to one of the sets of k-space data by solving an optimization problem, wherein the optimization problem comprises:
      a data consistency iteration step used to generate the reconstructed MR images, each of the reconstructed MR images corresponding to one of the sets of k-space data, and
      a denoising iteration step applied to the reconstructed MR images generated during the data consistency iteration step, wherein the denoising iteration step comprises:
         performing a 2D/3D block matching operation to identify similar patches across the reconstructed MR images; and
         using the similar patches across the reconstructed MR images in a sparsifying operation to provide sparse representations of the reconstructed MR images, wherein the sparse representations are used as an input to the data consistency iteration step of the optimization problem.

* * * * *